United States Patent
Bill et al.

(10) Patent No.: US 7,379,317 B2
(45) Date of Patent: May 27, 2008

(54) METHOD OF PROGRAMMING, READING AND ERASING MEMORY-DIODE IN A MEMORY-DIODE ARRAY

(75) Inventors: Colin S. Bill, Cupertino, CA (US); Swaroop Kaza, Woburn, MA (US); Tzu-Ning Fang, Palo Alto, CA (US); Stuart Spitzer, Lynnfield, MA (US)

(73) Assignee: Spansion LLC, Sunnyvale, CA (US)

( * ) Notice: Subject to any disclaimer, the term of this patent is extended or adjusted under 35 U.S.C. 154(b) by 108 days.

(21) Appl. No.: 11/021,958

(22) Filed: Dec. 23, 2004

(65) Prior Publication Data
US 2006/0139994 A1 Jun. 29, 2006

(51) Int. Cl.
*G11C 5/06* (2006.01)
*G11C 17/06* (2006.01)

(52) U.S. Cl. .......... 365/72; 365/105; 365/115; 365/175

(58) Field of Classification Search ............ 365/72, 365/105, 115, 175
See application file for complete search history.

(56) References Cited

U.S. PATENT DOCUMENTS

| 3,588,528 | A  | * | 6/1971  | Terman ................. 365/175 |
| 3,810,128 | A  | * | 5/1974  | Moser .................. 365/175 |
| 5,063,539 | A  | * | 11/1991 | Rallapalli .............. 365/175 |
| 5,471,087 | A  | * | 11/1995 | Buerger, Jr. ........... 365/175 |
| 6,567,296 | B1 | * | 5/2003  | Casagrande et al. ..... 365/105 |
| 6,947,321 | B2 | * | 9/2005  | Tanabe ................. 365/175 |
| 7,035,141 | B1 | * | 4/2006  | Tripsas et al. ......... 365/175 |
| 2002/0018366 | A1 |   | 2/2002  | von Schwerin et al. ..... 365/185.18 |
| 2003/0173612 | A1 |   | 9/2003  | Krieger et al. ......... 257/108 |
| 2003/0235085 | A1 |   | 12/2003 | Forbes ................. 365/189.09 |
| 2006/0002168 | A1 | * | 1/2006  | Krieger et al. |

* cited by examiner

*Primary Examiner*—Trong Phan (57) ABSTRACT

A memory array includes first and second sets of conductors and a plurality of memory-diodes, each connecting in a forward direction a conductor of the first set with a conductor of the second set. An electrical potential is applied across a selected memory-diode, from higher to lower potential in the forward direction, intended to program the selected memory-diode. During this intended programming, each other memory-diode in the array has provided thereacross in the forward direction thereof an electrical potential lower than its threshold voltage. The threshold voltage of each memory-diode can be established by applying an electrical potential across that memory-diode from higher to lower potential in the reverse direction. By so establishing a sufficient threshold voltage, and by selecting appropriate electrical potentials applied to conductors of the array, problems related to current leakage and disturb are avoided.

26 Claims, 10 Drawing Sheets

METHOD OF PROGRAMMING, READING AND ERASING MEMORY-DIODE IN A MEMORY-DIODE ARRAY

BACKGROUND OF THE INVENTION

1. Technical Field

This invention relates generally to memory devices, and more particularly, to a memory array incorporating memory-diodes.

2. Background Art

Generally, memory devices associated with computers and other electronic devices are employed to store and maintain information for the operation thereof. Typically, such a memory device includes an array of memory cells, wherein each memory cell can be accessed for programming, erasing, and reading thereof. Each memory cell maintains information in an "off" state or an "on" state, also referred to as "0" and "1" respectively, which can be read during the reading step of that memory cell.

Figure 1:
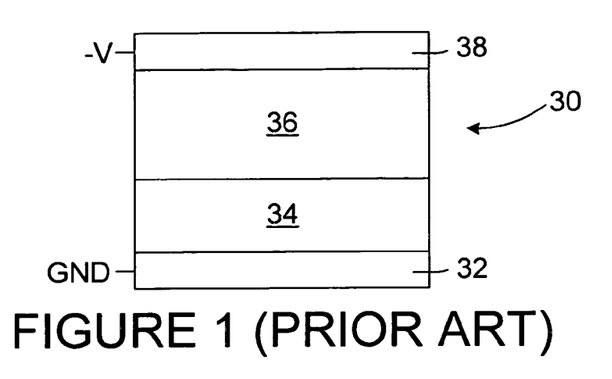
FIG. 1 is a cross-sectional view of a typical memory-diode, illustrating the programming thereof.
Figure 2:
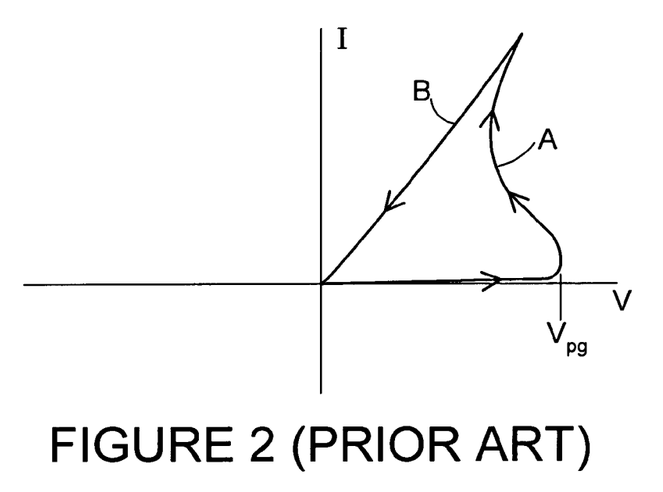
FIG. 2 is a plot of current vs. voltage in the programming of the memory-diode of FIG. 1.

As such electronic devices continue to be developed and improved, the amount of information required to be stored and maintained continues to increase. FIG. 1 illustrates a type of memory cell known as a memory-diode 30, which includes advantageous characteristics for meeting these needs. The memory-diode 30 includes an electrode 32, a superionic layer 34 on the electrode 32, an active layer 36 on the superionic layer 34, and an electrode 38 on the active layer 36. Initially, assuming that the memory-diode 30 is unprogrammed, in order to program the memory-diode 30, a negative voltage is applied to the electrode 38, while the electrode 32 is held at ground, so that an electrical potential $V_{pg}$ (the "programming" electrical potential) is applied across the memory-diode 30 from a higher to a lower electrical potential in the forward direction of the memory-diode 30 (see FIG. 2, a plot of memory diode current vs. electrical potential applied across the memory-diode 30). This potential is sufficient to cause copper ions to be attracted from the superionic layer 34 toward the electrode 38 and into the active layer 36 (A), causing the active layer 36 (and the overall memory-diode 30) to be in a (forward) low-resistance or conductive state. Upon removal of such potential (B), the copper ions drawn into the active layer 36 during the programming step remain therein, so that the active layer 36 (and memory-diode 30) remain in a conductive or low-resistance state.

Figure 3:
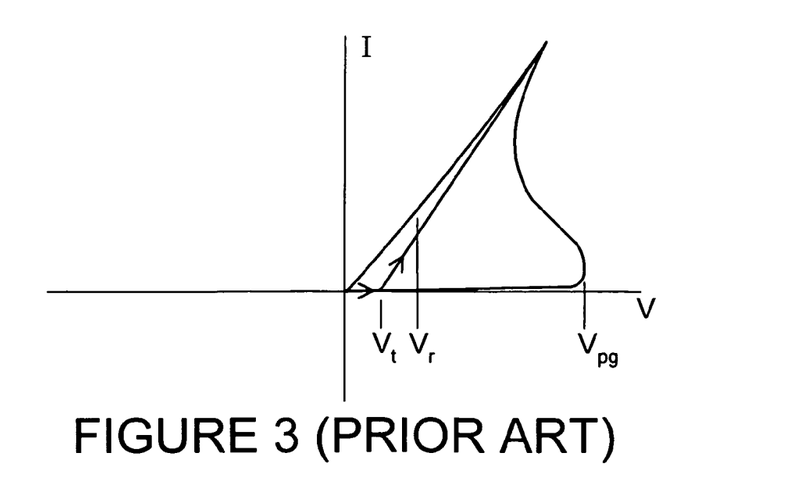
FIG. 3 is a plot of current vs. voltage in the reading of the programmed memory-diode of FIG. 1.

FIG. 3 illustrates the read step of the memory-diode 30 in its programmed (conductive) state. An electrical potential $V_r$ (the "read" electrical potential) is applied across the memory-diode 30 from a higher to a lower electrical potential in the forward direction of the memory-diode 30. This electrical potential is sufficient to overcome the threshold voltage $V_t$ of the inherent diode characteristic of the memory-diode 30, but is less than the electrical potential $V_{pg}$ applied across the memory-diode 30 for programming (see above). In this situation, the memory-diode 30 will readily conduct current, which indicates that the memory-diode 30 is in its programmed state.

In order to erase the memory-diode (FIG. 4), a positive voltage is applied to the electrode 38, while the electrode 32 is held at ground, so that an electrical potential $V_{er}$ (the "erase" electrical potential) is applied across the memory-diode 30 from a higher to a lower electrical potential in the reverse direction of the memory-diode 30. This potential is sufficient to cause copper ions to be repelled from the active layer 36 toward the electrode 32 and into the superionic layer 34, causing the active layer 36 (and the overall memory-diode 30) to be in a high-resistance or substantially non-conductive state (see FIG. 5, illustrating application of electrical potential $V_{er}$ across the memory-diode 30). This state remains upon removal of such potential from the memory-diode 30.

Figure 6:
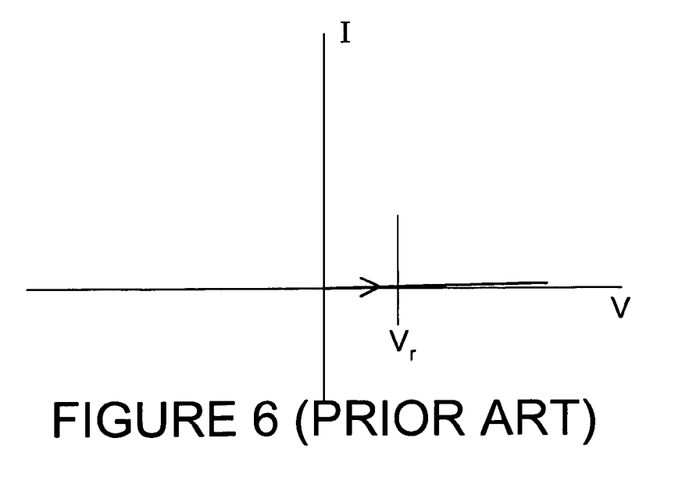
FIG. 6 is a plot of current vs. voltage in the reading of the erased memory-diode in accordance with FIG. 5.

FIG. 6 illustrates the read step of the memory-diode 30 in its erased (substantially non-conductive) state. The electrical potential $V_r$ is again applied across the memory-diode 30 from a higher to a lower electrical potential in the forward direction of the memory-diode 30, as described above. With the active layer 34 (and memory-diode 30) in a high-resistance or substantially non-conductive state, the memory-diode 30 will not conduct significant current, which indicates that the memory-diode 30 is in its erased state.

Figure 7:
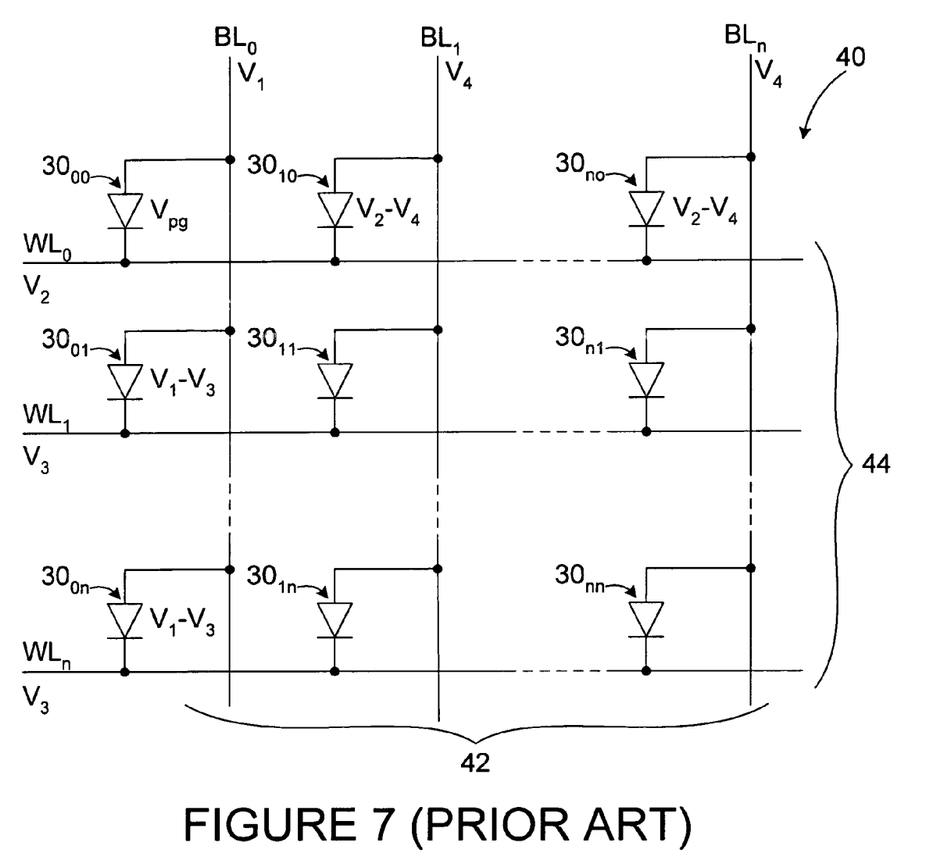
FIG. 7 is a schematic illustration of a memory array which includes memory-diodes in accordance with FIG. 1.

FIG. 7 illustrates a memory-diode array 40 which incorporates memory-diodes 30 of the type described above. As illustrated in FIG. 7, the memory-diode array 40 includes a first plurality 42 of parallel conductors (bit lines) $BL_0$, $BL_1$, ... $BL_n$, and a second plurality 44 of parallel conductors (word lines) $WL_0$, $WL_1$, ... $WL_n$ overlying and spaced from, orthogonal to, and crossing the first plurality of conductors 42. A plurality of memory-diodes 30 ($30_{00}$, $30_{10}$, $30_{n0}$, $30_{01}$, $30_{11}$, $30_{n1}$, $30_{0n}$, $30_{1n}$, $30_{nn}$ shown) of the type described above are included. Each memory-diode 30 connects a conductor BL of the first plurality 42 thereof with a conductor WL of the second plurality 44 thereof at the intersection of those conductors, with the memory-diode 30 thereof in a forward direction from the conductor BL of the first plurality 42 thereof to the conductor WL of the second plurality 44 thereof. For example, as shown in FIG. 7, memory-diode $30_{00}$ connects conductor $BL_0$ of the first plurality of conductors 42 with conductor $WL_0$ of the second plurality of conductors 44 at the intersection of those conductors $BL_0$, $WL_0$, memory-diode $30_{10}$ connects conductor $BL_1$ of the first plurality of conductors 42 with conductor $WL_0$ of the second plurality of conductors 44 at the intersection of those conductors $BL_1$, $WL_0$, etc.

In order to program a selected memory diode (FIG. 7), for example selected memory-diode $30_{00}$, the voltage $V_1$ applied to the conductor $BL_0$ must be $V_{pg}$ greater than the voltage $V_2$ applied to the conductor $WL_0$. However, in order to avoid an undesired disturb condition of any of the other memory-diodes in the array 40, the following approach can be undertaken. In furtherance thereof, a voltage $V_3$ greater than voltage $V_2$ is applied to each of the conductors $WL_1$-$WL_n$, with the difference between voltage $V_1$ and voltage $V_3$ being less than $V_{pg}$. Additionally, a voltage $V_4$ greater than voltage $V_2$ is applied to each of the conductors $BL_1$-$BL_n$, with the difference between voltage $V_4$ and voltage $V_2$ being less than $V_{pg}$. Furthermore, voltages $V_3$ and $V_4$ can be chosen as equal, so that each of the great majority of memory-diodes in the array 40, i.e., those memory-diodes not connected to either conductor $BL_0$ or conductor $WL_0$, has substantially no electrical potential applied thereacross, so as to minimize current leakage therethrough.

However, it has been found that the threshold voltage of a programmed memory-diode may well be very low, leading to problems as will now be described.

Figure 8:
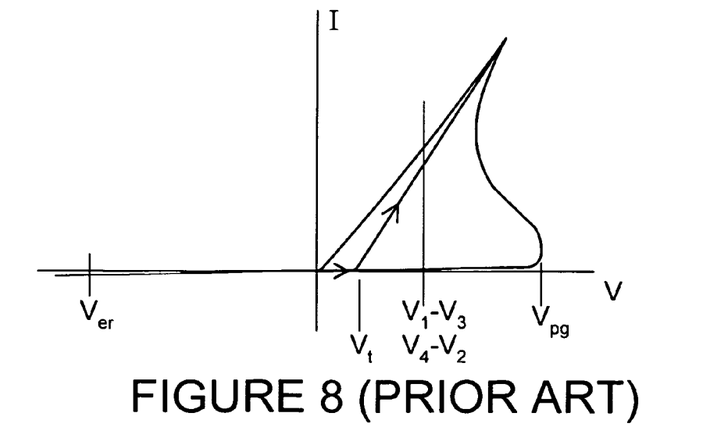
FIG. 8 is the plot of current vs. voltage illustrating the problem of leakage current of a programmed memory-diode of the array of FIG. 7.

As noted above, during the programming of the selected memory-diode $30_{00}$, the selected memory diode-$30_{00}$ has applied thereacross $V_{pg}$, i.e., ($V_1$-$V_2$) in the forward direction of that memory-diode $30_{00}$. Meanwhile (FIGS. 7 and 8), each of the other memory-diodes $30_{01}$-$30_{0n}$ connected to the conductor $BL_0$ has applied thereacross ($V_1$-$V_3$) in the forward direction, which is less than $V_{pg}$. However, in the case of programmed memory-diodes within the group of memory-diodes connected to the conductor $BL_0$, with the threshold voltage thereof being very low, electrical potential ($V_1$-$V_3$) applied across each of these programmed memory-diodes in the forward direction thereof may well be sufficient to overcome their respective threshold voltages $V_t$ so as to allow substantial current to pass therethrough. Meanwhile (FIGS. 7 and 8), each of the other memory-diodes connected to the conductor $WL_0$ has applied thereacross ($V_4$-$V_2$), which is less than $V_{pg}$. Again, in the case of the programmed memory-diodes within the group of memory-diodes $30_{10}$-$30_{n0}$ connected to the conductor $WL_0$, with the threshold voltage thereof being very low, electrical potential ($V_4$-$V_2$) applied across each of these programmed memory-diodes in the forward direction thereof may well be sufficient to overcome their respective threshold voltages $V_t$ so as to allow substantial current to pass therethrough. It will be readily seen that this approach results in significant current leakage during the programming of a selected memory-diode $30_{00}$, resulting in significant degradation in performance of the memory-diode array 40.

What is needed is an approach which overcomes the above-cited problems.

DISCLOSURE OF THE INVENTION

Broadly stated, the present invention is a method of undertaking a procedure on a selected memory-diode of a memory array, the memory array comprising a first plurality of parallel conductors, a second plurality of parallel conductors orthogonal to and crossing the first plurality of conductors, and a plurality of memory-diodes, each connecting in a forward direction a conductor of the first plurality thereof with a conductor of the second plurality thereof adjacent the intersection of those conductors. The method comprises providing an electrical potential across the selected memory-diode, from higher to lower potential in the forward direction of the selected memory-diode, intended to program the selected memory-diode to a conductive state, providing that, during the intended programming of the selected memory-diode, each other memory-diode in the array has provided thereacross in the forward direction thereof an electrical potential lower than its threshold voltage, providing an electrical potential across the selected memory-diode, from higher to lower potential in the reverse direction of the selected memory-diode, intended to erase the selected memory-diode, and providing that, during the intended erasing of the selected memory-diode, each other memory-diode in the array has provided thereacross in the reverse direction thereof an electrical potential lower than the electrical potential provided to erase the selected memory-diode.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 9:
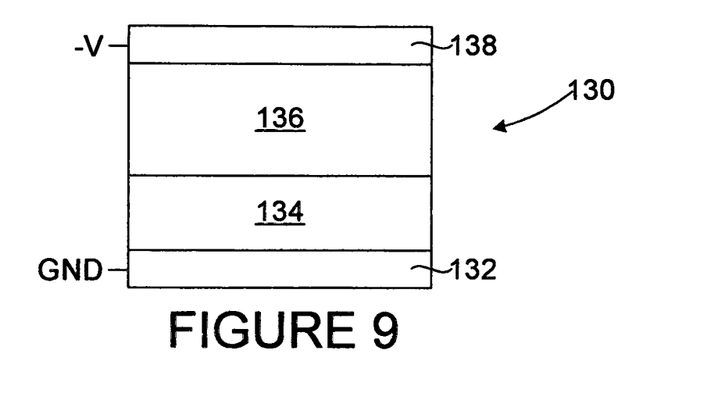
FIG. 9 is a view similar to that shown in FIGS. 1 and 4, illustrating the programming of the memory-diode.
Figure 10:
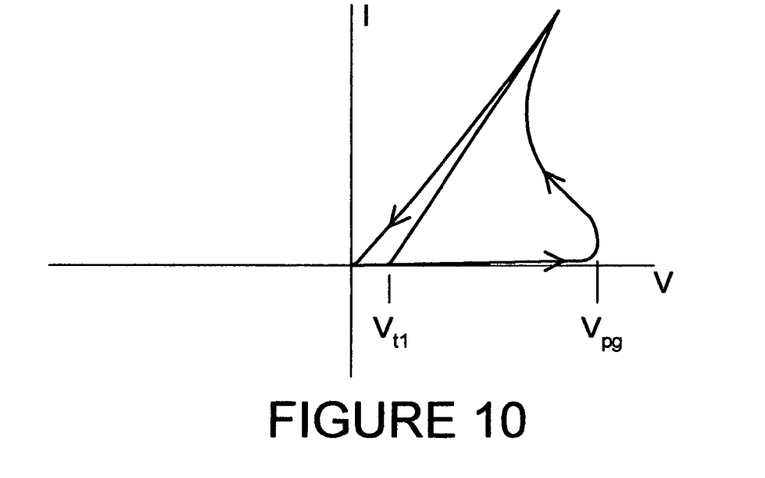
FIG. 10 is a plot of current vs. voltage in the programming of the memory-diode of FIG. 9, illustrating the inherent voltage threshold characteristic resulting from the programming of the memory-diode.

FIG. 9 is similar to FIG. 1, illustrating the programming of a memory-diode 130. The memory diode 130 includes for example a Cu electrode 132, a superionic $Cu_2S$ layer 134 on the electrode 132, an active $WO_3$ or F8T2 layer 136 on the $Cu_2S$ layer 134, and a Ti electrode 138 on the active layer 136. In programming the memory-diode 130, a negative voltage is applied to the electrode 138, while the electrode 132 is held at ground, so that a programming electrical potential $V_{pg}$ is applied across the memory-diode 130 from a higher to a lower electrical potential in the forward direction of the memory-diode 130 (see also FIG. 10). This potential is sufficient to cause copper ions to be attracted from the superionic layer 134 toward the electrode and 132 into the active layer 136, causing the active layer 136 (and the overall memory-diode 130) to be in a (forward) low-resistance or conductive state. Upon removal of such potential from the memory-diode 130, the copper ions drawn into the active layer 136 during the program step remain therein, so that the active layer 136 (and memory-diode 130) remain in a conductive or low-resistance state.

Figure 11:
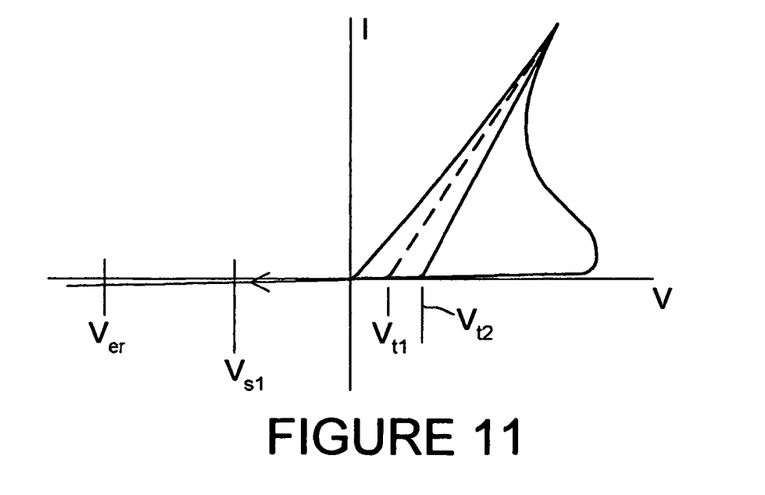
FIG. 11 is a plot of current vs. voltage illustrating the shifting of the threshold voltage of the programmed memory-diode.

As described above, with the memory-diode 130 in this conductive or low-resistance state, the inherent diode characteristic of the memory-diode 130 may well have a very low threshold voltage $V_{t1}$ (FIG. 10), leading to the problems described above. It had been found, however, that the threshold voltage $V_t$ of the memory-diode 130 may be increased by applying an electric field across the memory-diode 130, from higher to lower electrical potential in the reverse direction of the memory-diode 130, as a program completion step. For example, as illustrated in FIG. 11, applying an electric field $V_{s1}$ across the memory-diode 130, from higher to lower electrical potential in the reverse direction of the memory-diode 130, causes the threshold voltage of the memory-diode 130 to increase from $V_{t1}$ to $V_{t2}$, and establishes the threshold voltage of the memory diode 130 at $V_{t2}$. This electrical potential $V_{s1}$ applied to the memory-diode 130 to establish a new threshold voltage $V_{t2}$ is less than the electrical potential $V_{er}$ applied in the reverse direction of the memory-diode 130 to erase the memory diode 130, so as to avoid disturbing the state of the programmed memory-diode 130.

Figures 12, 13:
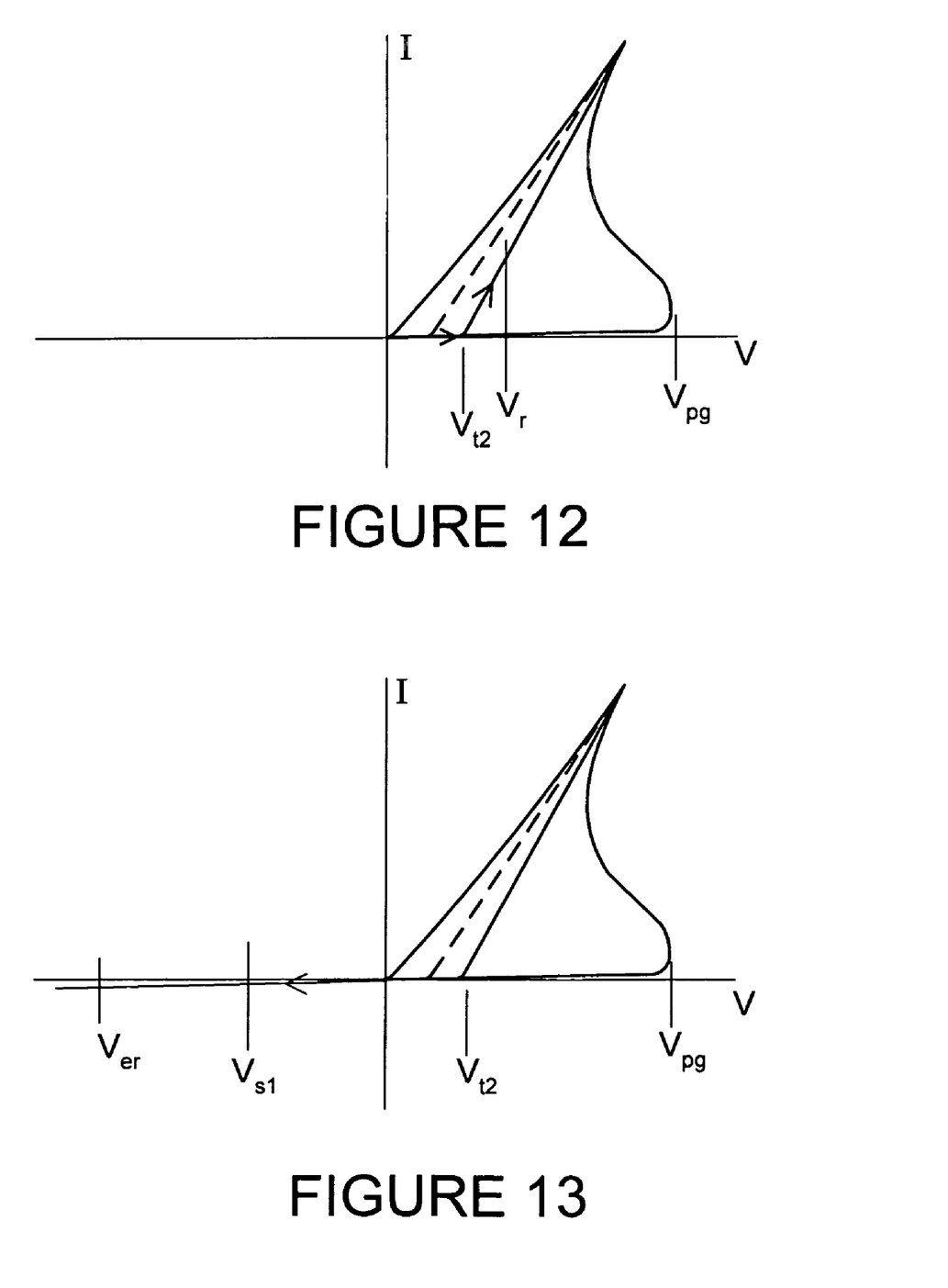
FIG. 12 is a plot of current vs. voltage illustrating the reading of the programmed memory-diode having a shifted threshold voltage.
FIG. 13 is a plot of current vs. voltage illustrating resetting of the threshold voltage of the memory-diode subsequent to the read step.

FIG. 12 illustrates the read step of the memory-diode 130 in the so-programmed (conductive) state as illustrated in FIG. 11. An electrical potential $V_r$ is applied across the memory-diode 130 from a higher to a lower electrical potential in the forward direction of the memory-diode 130. This electrical potential $V_r$ is sufficient to overcome the threshold voltage $V_{t2}$ of the memory-diode 130, but is less than the electrical potential $V_{pg}$ applied across the memory-diode 130 for programming. In this situation, the memory-diode 130 will readily conduct current, which indicates that the memory-diode 130 is in its programmed state.

It has been found that the read step as just described may disturb the established threshold voltage of the memory-diode 130, by lowering such threshold voltage from its previously selected and established level $V_{t2}$. In order to re-establish the selected threshold voltage $V_{t2}$, a read-completion step is undertaken (FIG. 13), wherein again the threshold voltage $V_t$ of the memory-diode 130 is increased to the previously established level $V_{t2}$ by applying an electric field $V_{s1}$ across the memory-diode 130, from higher to lower electrical potential in the reverse direction of the memory-diode 130, which causes the threshold voltage of the memory-diode 130 to increase to $V_{t2}$, again establishing the threshold voltage of the memory-diode at $V_{t2}$.

It has been found that the amount of increase in threshold voltage $V_t$ of the memory-diode 130 is dependent on the magnitude of electrical potential so applied across the memory-diode 130 from higher to lower electrical potential in the reverse direction thereof. That is, while such an electrical potential of a magnitude $V_{s1}$ determines a threshold voltage of $V_{t2}$, an electrical potential of a magnitude $V_{s2}$, chosen as greater than $V_{s1}$, determines a threshold voltage $V_{t3}$ which is greater than $V_{t2}$ (compare FIGS. 11 and 14), i.e., a proportionality exists between the magnitude of the electrical potential and the magnitude of the threshold voltage $V_t$. However, in the case where an electrical potential has been applied to determine a magnitude of threshold voltage $V_t$ (for example, electrical potential $V_{s2}$ applied to determine threshold voltage $V_{t3}$), if another electrical potential is applied which is lower in magnitude than the original applied electrical potential (for example $V_{s1}$, of a lower magnitude than $V_{s2}$), the level of threshold voltage ($V_{t3}$) does not change, i.e., the level of threshold voltage $V_t$ is established by the highest magnitude of electrical potential applied (and remains in this example $V_{t3}$).

Thus, the threshold voltage of the memory-diode 130 can be tailored to the specific needs of the application. Again, this electrical potential applied to the memory-diode 130 to establish a new threshold voltage is less than the electrical potential $V_{er}$ applied in the reverse direction of the memory-diode 130 to erase the memory-diode 130, so as to avoid a disturb condition of the state of the programmed memory-diode 130.

Figure 14:
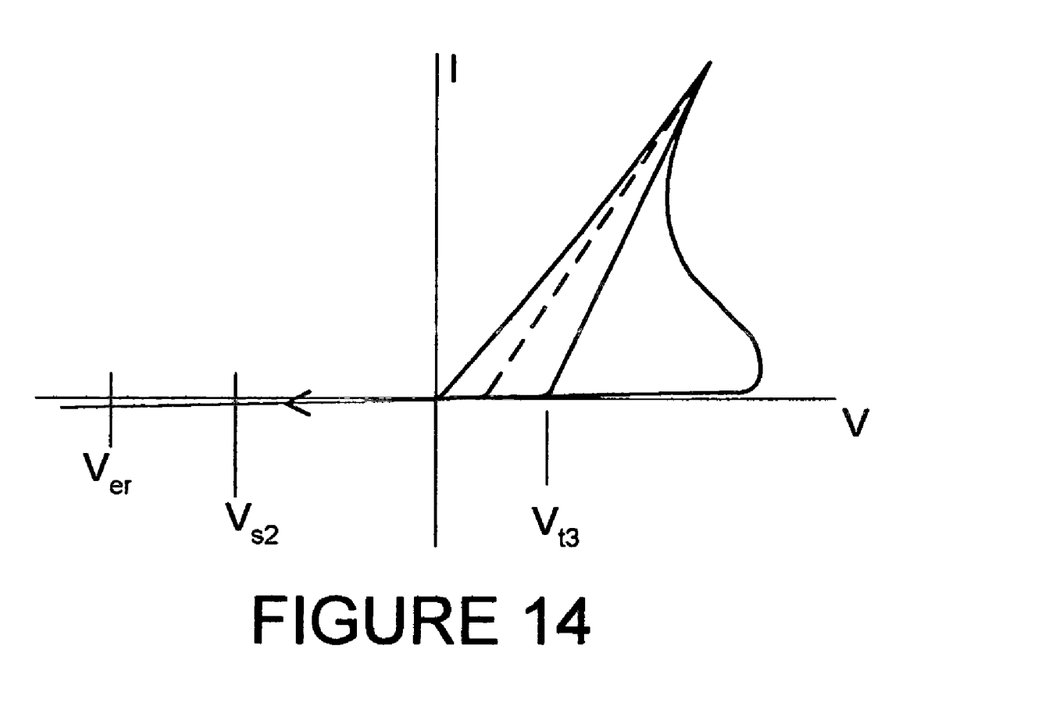
FIG. 14 is a plot of current vs. voltage illustrating the shifting of the threshold voltage thereof to a different level.
Figure 15:
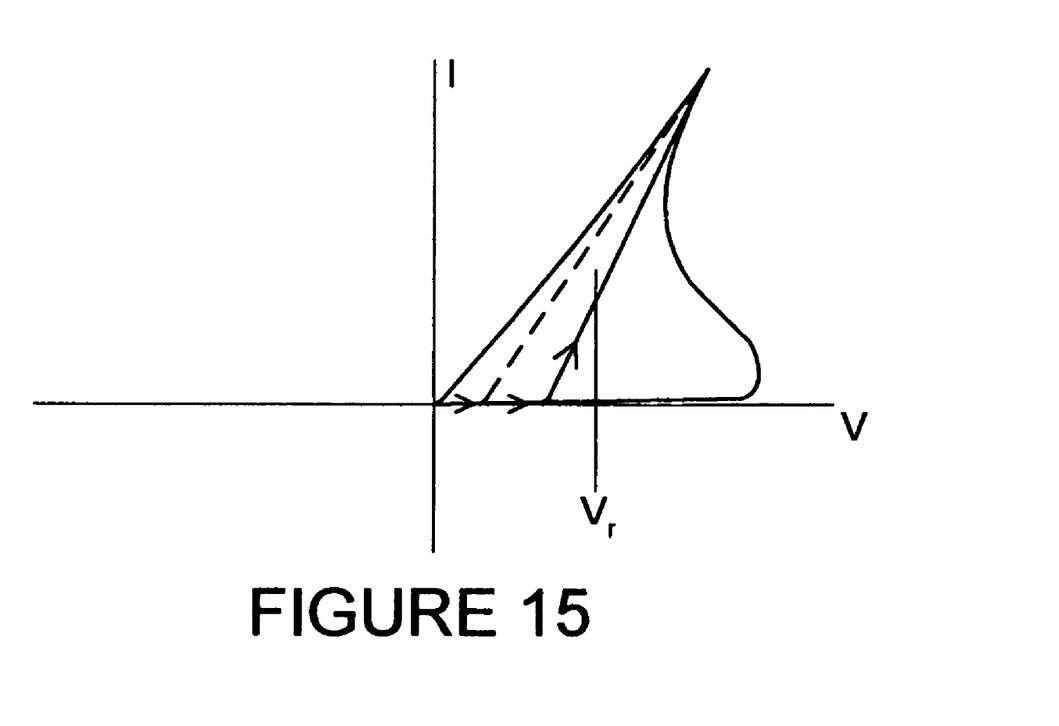
FIG. 15 is a plot of current vs. voltage illustrating the reading of the memory-diode having the threshold voltage thereof shifted to a different level.

FIG. 15 illustrates the read step of the so-programmed memory-diode 130 in its programmed (conductive) state as illustrated in FIG. 14. An electrical potential $V_r$ is applied across the memory-diode 130 from a higher to a lower electrical potential in the forward direction of the memory-diode 130. This electrical potential is sufficient to overcome the threshold voltage $V_{t3}$ of the memory-diode 130, but is less than the electrical potential $V_{pg}$ applied across the memory-diode 130 for programming. In this situation, the memory-diode 130 will readily conduct current, which indicates that the memory-diode 130 is in its programmed state. Again, a read-completion step as described above is undertaken to re-establish the threshold voltage $V_{t3}$ of the memory-diode 130.

Figure 4:
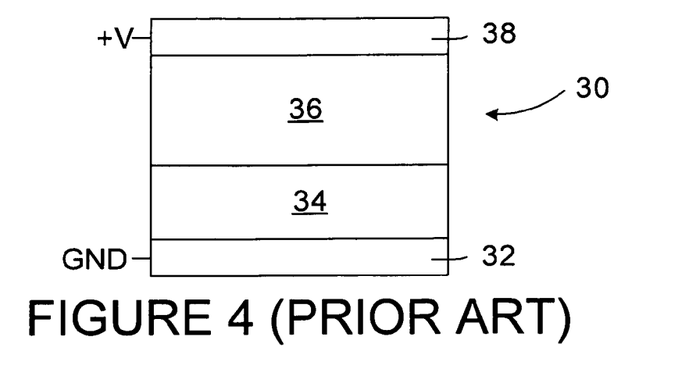
FIG. 4 is a view similar to that shown in FIG. 1, illustrating the erasing of the memory-diode.
Figure 5:
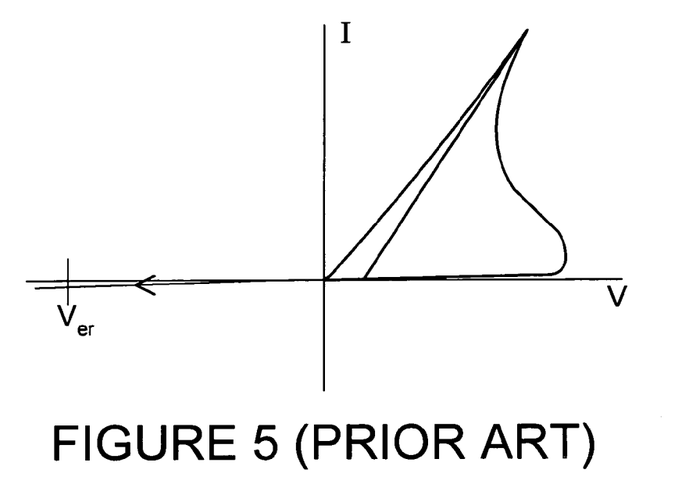
FIG. 5 is a plot of current vs. voltage in the erasing of a programmed memory-diode in accordance with FIG. 4.
Figure 16:
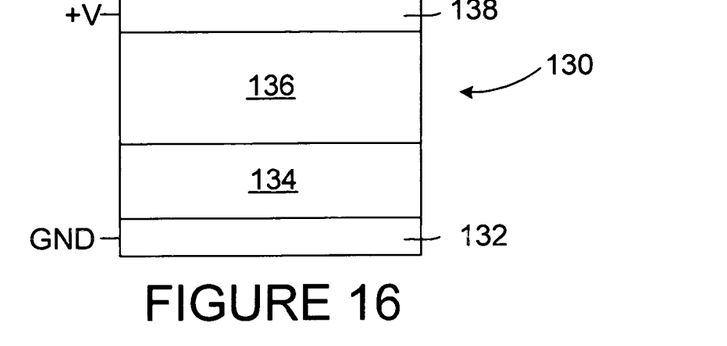
FIG. 16 is a view similar to that shown in FIGS. 1, 4 and 9, illustrating the erasing of the memory-diode.
Figure 17:
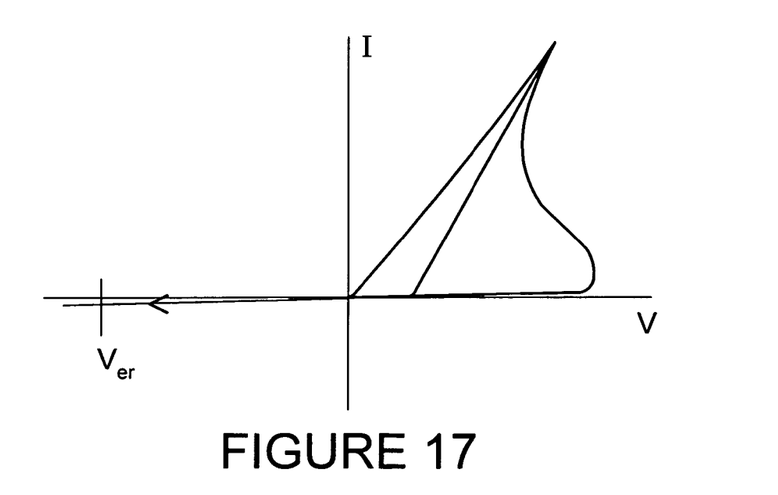
FIG. 17 is a plot of current vs. voltage in the erasing of the memory-diode of FIG. 16.

FIG. 16 is similar to FIG. 4, illustrating the erasing of the memory-diode 130. A positive voltage is applied to the electrode 138, while the electrode 132 is held at ground, so that an electrical potential $V_{er}$ is applied across the memory-diode 130 from a higher to a lower electrical potential in the reverse direction of the memory-diode 130 (see also FIG. 17). This potential is greater than the electrical potential $V_s$ applied to establish a memory-diode threshold voltage as described above, and is sufficient to cause copper ions to be repelled from the active layer 136 toward the electrode 132 and into the superionic layer 134, causing the active layer 136 (and the overall memory-diode 130) to be in a high-resistance or substantially non-conductive state. This state remains upon removal of such potential from the memory-diode 130.

Figure 18:
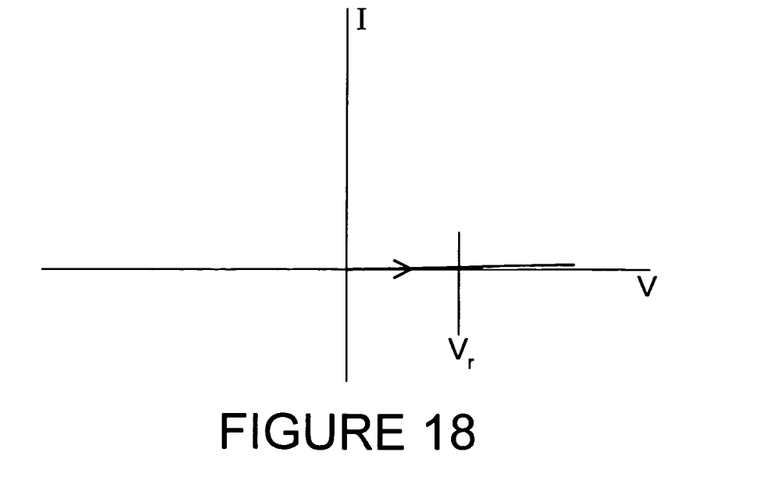
FIG. 18 is a plot of current vs. voltage illustrating the reading of the erased memory-diode.

FIG. 18 illustrates a verification step for the memory-diode 130 in its erased (substantially non-conductive) state, which is undertaken immediately after the erase procedure. The electrical potential $V_r$ (which is the electrical potential applied in reading the state of the memory-diode 130, see below, since the present step is actually a read step) is applied across the memory-diode 130 from a higher to a lower electrical potential in the forward direction of the memory-diode 130. This electrical potential is less than the electrical potential $V_{pg}$ applied across the memory-diode 130 for programming. If the memory-diode 130 has been properly erased, i.e., the memory-diode 130 is in a high-resistance or substantially non-conductive state, the memory-diode 130 will not conduct significant current.

FIG. 18 also illustrates the read step for the memory-diode 130 in its erased state, undertaken to determine the state of that memory-diode 130. Again, the electrical potential $V_r$ is applied across the memory-diode 130 from a higher to a lower electrical potential in the forward direction of the memory-diode 130. The memory-diode 130 will not conduct significant current in its erased, i.e., high resistance or substantially non-conductive state.

Figure 19:
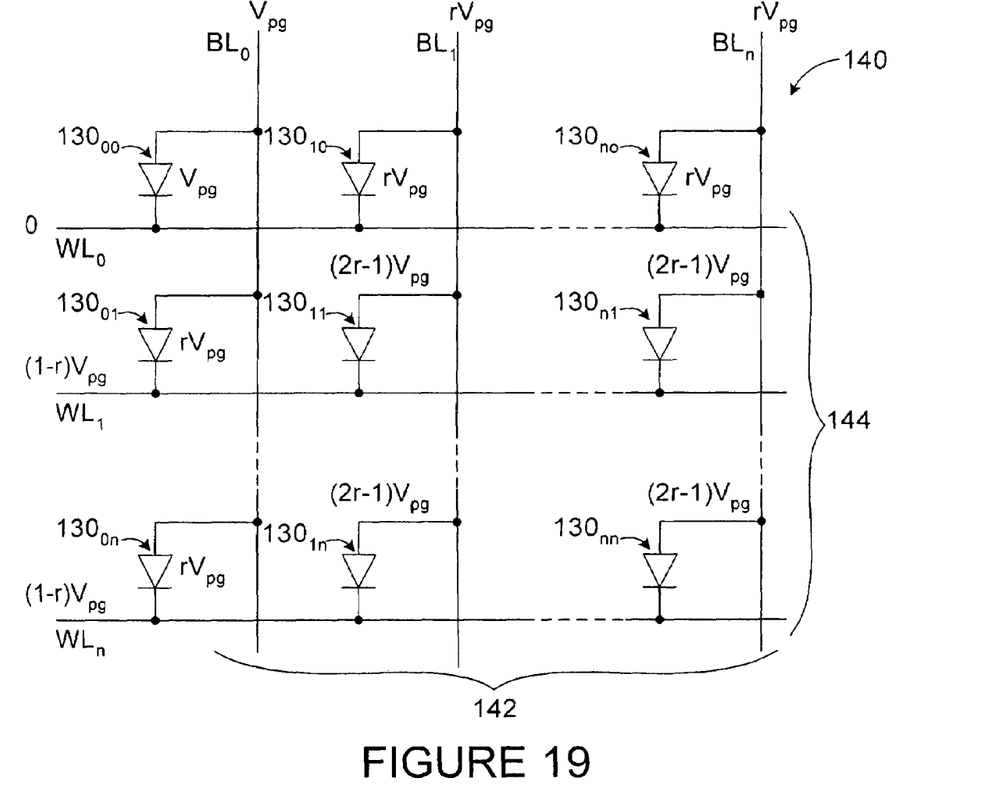
FIG. 19 is a schematic illustration of a memory array which includes memory-diodes, and further illustrating programming of a selected memory-diode.
Figure 20:
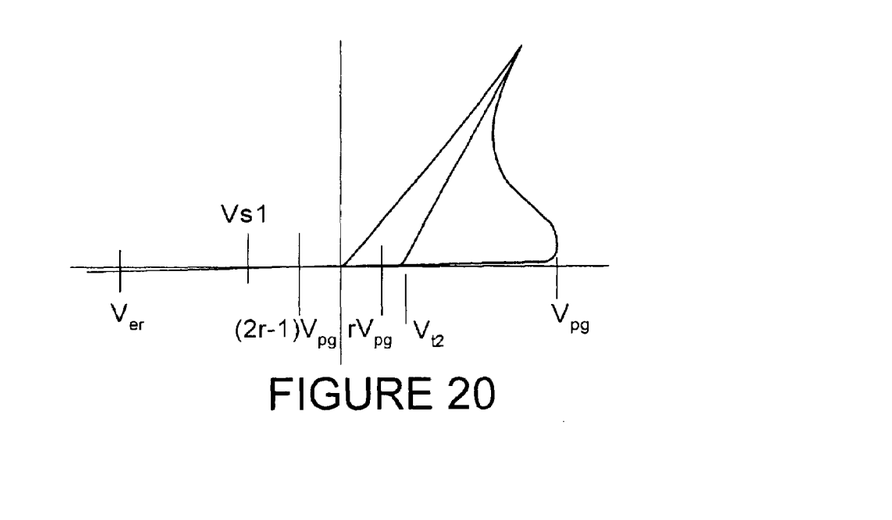
FIG. 20 is a plot of current vs. voltage illustrating characteristics of a programmed memory-diode under different conditions.

FIG. 19 is similar to FIG. 7 and illustrates a memory diode array 140 which incorporates memory-diodes 130 of the type described. As illustrated in FIG. 19, and with reference to FIG. 20, the memory-diode array 140 includes a first plurality 142 of parallel conductors (bit lines) $BL_0$, $BL_1$, . . . $BL_n$, and a second plurality 144 of parallel conductors (word lines) $WL_0$, $WL_1$, . . . $WL_n$ overlying and spaced from, orthogonal to, and crossing the first plurality of conductors 142. A plurality of memory-diodes 130 ($130_{00}$, $130_{10}$, $130_{n0}$, $130_{01}$, $130_{11}$, $130_{n1}$, $130_{0n}$, $130_{1n}$, $130_{nn}$ shown) of the type described above are included. Each memory-diode 130 connects a conductor BL of the first plurality 142 thereof with a conductor WL of the second plurality 144 thereof at the intersection of those conductors, with the memory-diode 130 thereof in a forward direction from the conductor BL of the first plurality 142 thereof to the conductor WL of the second plurality 144 thereof. For example, as shown in FIG. 19, memory-diode $130_{00}$ connects conductor $BL_0$ of the first plurality of conductors 142 with conductor $WL_0$ of the second plurality of conductors 144 at the intersection of those conductors $BL_0$, $WL_0$, memory-diode $130_{10}$ connects conductor $BL_1$ of the first plurality of conductors 142 with conductor $WL_0$ of the second plurality of conductors 144 at the intersection of those conductors $BL_1$, $WL_0$, etc.

In order to program a selected memory-diode, for example selected memory-diode $130_{00}$, an electrical potential $V_{pg}$ is to be applied thereacross in the forward direction of the memory-diode $130_{00}$. For the sake of clarity, the voltage $V_{pg}$ is shown as applied to the conductor $BL_0$, while 0 voltage is shown as applied to the conductor $WL_0$, so that the potential $V_{pg}$ is established across the memory-diode $130_{00}$ in the forward direction thereof. In order to overcome the problems described above, wherein voltages applied to conductors are such that threshold voltages of non-selected memory-diodes in the array 140 may be surpassed, providing substantial current leakage, voltages are applied to the conductors $BL_1$-$BL_n$ and the conductors $WL_1$-$WL_n$ to establish that each of the memory-diodes connected to the conductors $BL_0$-$BL_n$ and each of the memory-diodes connected to the conductors $WL_0$-$WL_n$, other than the selected memory-diode $130_{00}$, has applied thereto in the forward direction an electrical potential $rV_{pg}$, where $r<1$ and $rV_{pg}$<threshold voltage (for example $V_{t2}$) of the memory-diode to which the electrical potential $rV_{pg}$ is applied (see also FIG. 20). It will be seen that the selection of the value of r can be tied to the selection of the level of established threshold voltage, and vice versa. That is, if a relatively high level of threshold voltage is established, the value r can be relatively high, and if conversely a relatively low level of threshold voltage is established, the value of r must be relatively low.

The electrical potential $rV_{pg}$ can be established across each of the memory-diodes connected to the conductor $WL_0$ (other than the selected memory-diode $130_{00}$) by applying a voltage $rV_{pg}$ to each of the conductors $BL_1$-$BL_n$. In order to establish the electrical potential $rV_{pg}$ across each of the memory-diodes connected to the conductor $BL_1$ (other than the selected memory-diode), a voltage $(1-r)V_{pg}$ is applied to each conductor $WL_1$-$WL_n$. The value of r is selected to provide that each of the programmed memory-diodes connected to the conductor $BL_0$ and the conductor $WL_0$, other than the selected memory-diode $130_{00}$, has an electrical potential applied thereacross in the forward direction thereof which is lower than the its threshold voltage $V_{t2}$. Furthermore, each of the other memory-diodes in the array 140, i.e., those memory-diodes 130 connected to neither the conductor $BL_0$ nor the conductor $WL_0$, has applied thereacross in the forward direction thereof an electrical potential of $(2r-1)V_{pg}$. If $(2r-1)V_{pg}$ is negative, the value of r is provided so that electrical potential $(2r-1)V_{pg}$ applied across the memory-diode from higher to lower potential in the reverse direction is less than the electrical potential $V_{s1}$ (establishing threshold value $V_{t2}$) applied from higher to lower potential in the reverse direction, avoiding disturbance of the threshold voltage $V_{t2}$. This also establishes that electrical potential $(2r-1)V_{pg}$ applied across the memory-diode from higher to lower potential in the reverse direction is less than the electrical potential $V_{er}$ applied from higher to lower potential in the reverse direction. If $(2r-1)V_{pg}$ is positive, the value of r is provided so that electrical potential $(2r-1)V_{pg}$ applied across the memory-diode from higher to lower potential in the forward direction of the memory-diode is less than the threshold voltage $V_{t2}$ to which it is applied. Thus, the state of any programmed memory-diode subject to such electrical potential is not disturbed, i.e., is maintained, and the threshold voltage of any unselected memory-diode is not surpassed. It will thus be seen that each memory-diode in the array (other than the selected memory-diode $130_{00}$) has applied thereacross in the forward direction an electrical potential lower than the threshold voltage $V_{t2}$ of that memory-diode.

The ability to select the threshold voltages of the memory-diodes in the array allows for wide latitude in the selection of the value r, increasing flexibility of overall approach.

Figure 21:
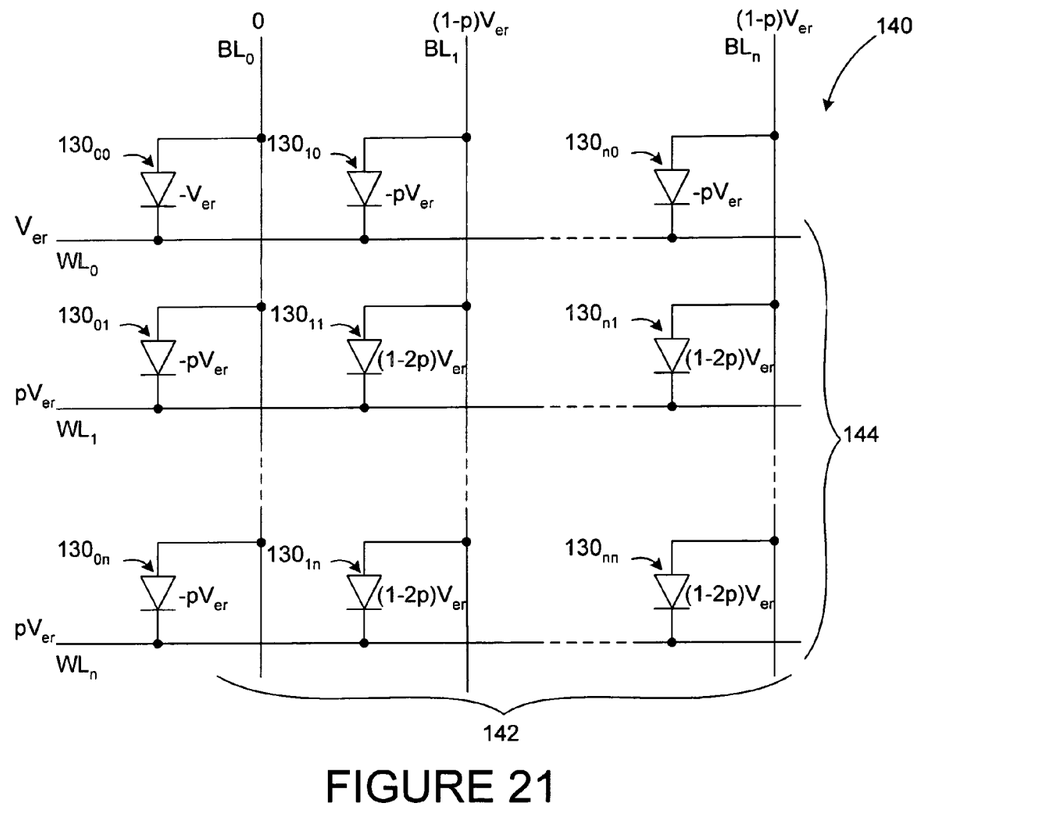
FIG. 21 is a schematic illustration of the memory array of FIG. 19, further illustrating erasing of a selected memory-diode.

FIG. 21 is similar to FIG. 19, but illustrates the erasing of a selected memory diode.

Figure 22:
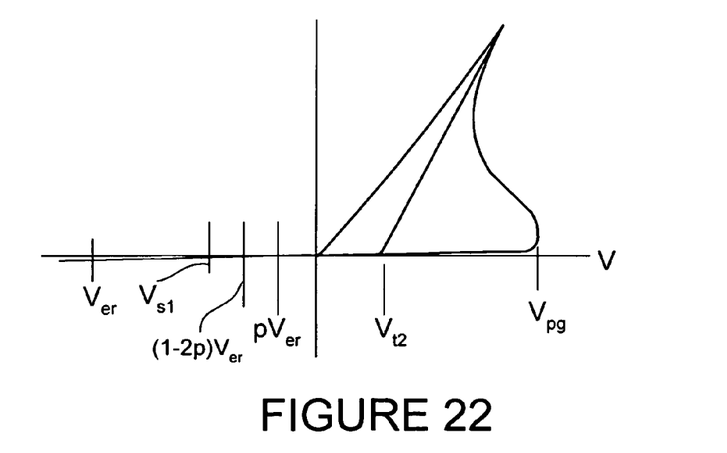
FIG. 22 is a plot of current vs. voltage illustrating characteristics of an erased memory-diode under different conditions.

In order to erase a selected memory-diode, for example selected memory-diode $130_{00}$, an electrical potential $V_{er}$ must be applied thereacross in the reverse direction of the memory-diode. For the sake of clarity, the voltage $V_{er}$ is shown as applied to the conductor $WL_0$, while 0 voltage is shown as applied to the conductor $BL_0$, so that the potential $V_{er}$ is established across the memory-diode $130_{00}$, from higher to lower electrical potential, in the reverse direction thereof. Voltages are applied to the conductors $BL_1$-$BL_n$ and the conductors $WL_1$-$WL_n$ to establish that each of the memory-diodes connected to the conductor $BL_0$ and each of the memory-diodes connected to the conductor $WL_0$ (other than the selected memory-diode $130_{00}$) has applied thereto in a reverse direction an electrical potential $pV_{er}$ (forward direction $-pV_{er}$), where $p<1$ (see also FIG. 22).

This electrical potential $pV_{er}$ in the reverse direction can be established across each of the memory-diodes connected to the conductor $BL_0$ (other than the selected memory-diode $130_{00}$) by applying a voltage $pV_{er}$ to each of the conductors $WL_1$-$WL_n$. In order to establish the electrical potential $pV_{er}$ in the reverse direction across each of the memory-diodes connected to the conductor $WL_0$ (other than the selected memory-diode $130_{00}$), a voltage $(1-p)V_{er}$ is applied to each of the conductors $BL_1$-$BL_n$. It has now been provided that each of the memory-diodes connected to the conductor $BL_0$ and the conductor $WL_0$, other than the selected memory-diode $130_{00}$, has an electrical potential applied thereacross in the forward direction thereof which is lower than the its threshold voltage (indeed is negative in the forward direction). Additionally, the value of r is chosen so that the value $pV_{er}$, applied from higher to lower potential in the reverse direction of the memory-diode is less than the value $V_{s1}$ establishing the threshold voltage $V_{t2}$ for that memory-diode, avoiding disturbance of the threshold value $V_{t2}$. Furthermore, each of the other memory-diodes in the array 140, i.e., those memory-diodes connected to neither the conductor $BL_0$ nor the conductor $WL_0$, has applied thereacross in the forward direction thereof an electrical potential of $(1-2p)V_{er}$. If $(1-2p)V_{er}$ is positive, the value of p is provided so that the electrical potential $(1-2p)V_{er}$ applied from higher to lower potential in the forward direction of a memory-diode subjected thereto is less than the threshold voltage thereof, insuring that programmed memory-diodes subject to this potential will not turn on. If $(1-2p)V_{er}$ is negative, p is provided so that electrical potential $(1-2p)V_{er}$ applied from higher to lower potential in the reverse direction of the memory-diode subjected thereto is less than the electrical potential $V_{s1}$, applied from higher to lower potential in the reverse direction, used to establish memory-diode threshold value $V_{t2}$, avoiding disturbance of the set threshold voltage $V_{t2}$. This in turn insures that the level of such applied electrical potential is insufficient to erase a programmed memory-diode to which it is applied. Thus, the state of any programmed memory-diode exposed to the electrical potential $pV_{er}$ or the electrical potential $(1-2p)V_{er}$ will be maintained, i.e. not disturbed. Furthermore, it will be noted that any such electrical potential as specified above considered as applied in the forward direction of a memory-diode is clearly less than the threshold voltage $V_t$ of that memory diode. It will thus be seen that each memory-diode in the array 140 (other than the selected memory-diode $130_{00}$) has applied thereacross in the forward direction an electrical potential lower than the threshold voltage $V_{t2}$ of that memory-diode.

Figure 23:
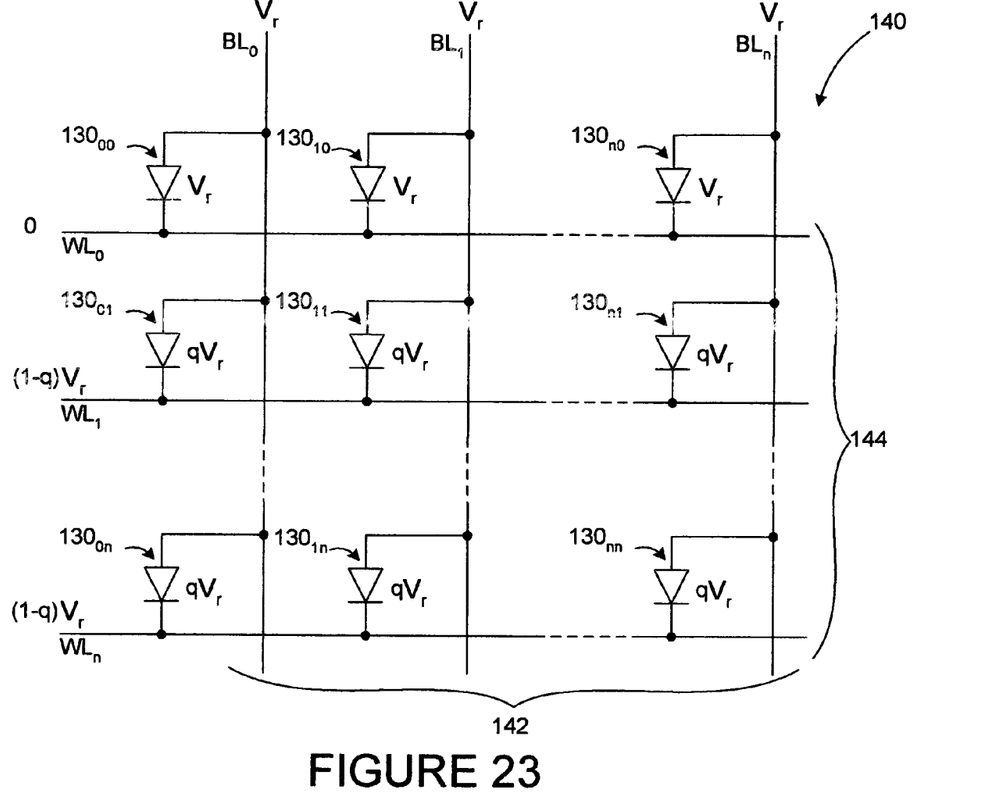
FIG. 23 is a schematic illustration of the memory array of FIGS. 19 and 21, further illustrating reading of a selected memory-diode.
Figure 24:
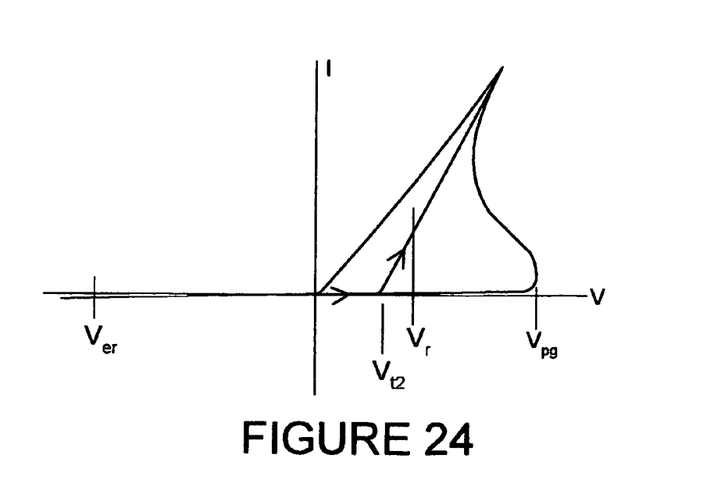
FIG. 24 is a plot of current vs. voltage illustrating characteristics of a memory diode under read conditions.

FIG. 23 is similar to FIGS. 19 and 21 but illustrates the reading of a selected memory-diode $130_{00}$. In order to read the state of a selected memory-diode $130_{00}$, an electrical potential $V_r$ must be applied thereacross from a higher to a lower electrical potential in the forward direction of the memory-diode $130_{00}$. This electrical potential is sufficient to overcome the threshold voltage $V_{t2}$ of the selected memory diode $130_{00}$ if that memory-diode $130_{00}$ is in a programmed state, but is less than the electrical potential $V_{pg}$ which would undesirably program a memory-diode in an erased state. In furtherance thereof, and for the sake of clarity, the voltage $V_r$ is shown as applied to the conductor $BL_0$, while 0 voltage is shown as applied to the conductor $WL_0$, so that the electrical potential $V_r$ is established across the memory-diode $130_{00}$ in the forward direction thereof. In page mode read, each of the other conductors $BL_1$-$BL_n$ also has applied thereto $V_r$. Each of the other conductors has applied thereto voltage $(1-q)V_r$, where q<1. If q has a value chosen as close to 0, the electrical potential applied across each of the memory-diodes connected to the conductors WL1-WLn, i.e., electrical potential $qV_r$, will be close to 0. This electrical potential would not be sufficient to cause any programmed memory-diodes connected to the conductors WL1-WLn to conduct, nor would any erased memory-diodes connected to the conductors WL1-WLn so conduct (FIG. 24).

It will be seen as herein is provided a highly efficient approach for programming, erasing, and reading memory-diodes in a memory diodes array. This approach is highly effective in avoiding problems of current leakage and disturbance, as described above.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of providing a state of a memory-diode comprising:
   applying a first electrical potential across the memory-diode to provide a memory-diode conductive state; and
   applying a second electrical potential across the memory-diode to establish a memory-diode threshold voltage for the memory-diode in its conductive state, beyond which the memory-diode remains in its conductive state.

2. The method of claim 1 wherein the first electrical potential is applied from higher to lower electrical potential in the forward direction of the memory-diode.

3. The method of claim 2 wherein the second electrical potential is applied from higher to lower electrical potential in the reverse direction of the memory-diode.

4. The method of claim 1 wherein the second electrical potential is applied from higher to lower electrical potential in the reverse direction of the memory-diode.

5. The method of claim 1 and further comprising applying a third electrical potential across the memory-diode from higher to lower electrical potential in the reverse direction of the memory-diode, the third electrical potential being greater than the second electrical potential.

6. The method of claim 4 and further comprising applying a third electrical potential across the memory-diode from higher to lower electrical potential in the reverse direction of the memory-diode, the third electrical potential being greater than the second electrical potential.

7. The method of claim 6 wherein the step of applying a third electrical potential across the memory-diode from higher to lower electrical potential in the reverse direction of the memory-diode is a memory diode erase step.

8. A method of establishing a threshold voltage of a conductive memory-diode beyond which the memory-diode remains in its conductive state, comprising applying an electrical potential across the memory-diode, from higher to lower electrical potential in the reverse direction of the memory-diode.

9. The method of claim 8 wherein the established threshold voltage of the memory-diode is dependent on the magnitude of the electrical potential applied across the memory-diode, from higher to lower electrical potential in the reverse direction of the memory-diode.

10. The method of claim 9 wherein the established threshold voltage of the memory-diode increases with increase in the magnitude of the electrical potential applied across the memory-diode, from higher to lower electrical potential in the reverse direction of the memory-diode.

11. A method of undertaking a procedure on a memory-diode comprising:
provide an electrical potential across the memory-diode from higher to lower electrical potential in the reverse direction of the memory-diode, to provide an erase state of the memory-diode; and
applying an electrical potential across the memory-diode from higher to lower electrical potential in the forward direction of the memory-diode to verify the state of the memory diode.

12. The method of claim 11 wherein the step of applying an electrical potential across the memory-diode from higher to lower electrical potential in the forward direction of the memory diode is a memory diode read step.

13. A method of undertaking a procedure on a memory-diode which is in a conductive state, comprising:
applying an electrical potential across the memory-diode from higher to lower electrical potential in the forward direction of the memory-diode, to read the state of the memory-diode; and
applying an electrical potential across the memory-diode from higher to lower electrical potential in the reverse direction of the memory-diode to establish a memory-diode threshold voltage.

14. The method of claim 13 wherein the procedure undertaken on the memory-diode is a read-completion procedure.

15. A method of undertaking a procedure on a selected memory-diode of a memory array, said memory array comprising a first plurality of conductors, a second plurality of conductors, and a plurality of memory-diodes, each connecting a conductor of the first plurality thereof with a conductor of the second plurality thereof, comprising;
providing an electrical potential across the selected memory-diode, from higher to lower electrical potential in the forward direction of the selected memory-diode, to program the selected memory-diode to a conductive state; and
providing that, during the programming of the selected memory-diode, each other programmed memory-diode in the array has provided thereacross in the forward direction thereof an electrical potential lower than its threshold voltage.

16. The method of claim 15 and further comprising the step of, after programming the selected memory-diode to a conductive state, applying an electrical potential across the selected memory-diode, from higher to lower electrical potential in the reverse direction of the selected memory-diode, to determine a threshold voltage of the selected memory-diode.

17. The method of claim 16 and further comprising providing that, during the programming of the selected memory-diode, each other memory-diode in the array has provided thereacross in the forward direction thereof an electrical potential lower than its threshold voltage.

18. A method of erasing a selected programmed memory-diode of a memory array, said memory array comprising a first plurality of conductors, a second plurality of conductors crossing the first plurality of conductors, and a plurality of memory-diodes, each connecting a conductor of the first plurality thereof with a conductor of the second plurality thereof, comprising;
providing an electrical potential across the selected memory-diode, from higher to lower potential in the reverse direction of the selected memory-diode, to erase the selected memory-diode and provide an erase state thereof; and
providing that, during the erasing of the selected memory-diode, each other programmed memory-diode in the array has provided thereacross in the reverse direction thereof an electrical potential lower than the electrical potential provided to erase the selected memory-diode.

19. The method of claim 18 and further comprising providing that, during the erasing of the selected memory-diode, each other memory-diode in the array has provided thereacross in the reverse direction thereof an electrical potential lower than the electrical potential provided to erase the selected memory-diode.

20. The method of claims 18 and further comprising, after undertaking the erase of the selected memory-diode, applying an electrical potential across the selected memory-diode from higher to lower electrical potential in the forward direction of the selected memory-diode to verify the state of the selected memory diode.

21. The method of claim 20 wherein the step of applying an electrical potential across the selected memory-diode from higher to lower electrical potential in the forward direction of the selected memory-diode is a memory-diode read step.

22. A method of undertaking a procedure on a selected memory-diode of a memory array, said memory array comprising a first plurality of parallel conductors, a second plurality of parallel conductors orthogonal to and crossing the first plurality of conductors, and a plurality of memory-diodes, each connecting a conductor of the first plurality thereof with a conductor of the second plurality thereof, comprising;
providing an electrical potential across the selected memory-diode, from higher to lower potential in the forward direction of the selected memory-diode, to program the selected memory-diode to a conductive state;
providing that, during the programming of the selected memory diode, each other memory diode in the array has provided thereacross in the forward direction thereof an electrical potential lower than its threshold voltage;
providing an electrical potential across the selected memory-diode, from higher to lower potential in the reverse direction of the selected memory-diode, to erase the selected memory-diode and provide an erase state thereof; and
providing that, during the erasing of the selected memory-diode, each other memory-diode in the array has provided thereacross in the reverse direction thereof an electrical potential lower than the electrical potential provided to erase the selected memory-diode.

23. The method of claim 22 and further comprising the step of, after programming the selected memory-diode to a conductive state and prior to erasing the selected memory-diode, applying an electrical potential across the selected memory-diode, from higher to lower electrical potential in the reverse direction of the selected memory-diode, to determine a threshold voltage of the selected memory-diode.

24. The method of claim 22 and further comprising the step of, after programming the selected memory-diode to a conductive state and prior to erasing the selected memory-diode, applying an electrical potential across the programmed selected memory-diode from higher to lower electrical potential in the forward direction of the selected memory-diode, to read the state of the selected memory-diode; and applying an electrical potential across the selected memory-diode from higher to lower electrical potential in the reverse direction of the memory-diode to establish a threshold voltage of the selected memory-diode.

25. The method of claim 22 and further comprising the step of, after undertaking the erase of the selected memory-diode, applying an electrical potential across the selected memory-diode from higher to lower electrical potential in the forward direction of the selected memory-diode to verify the state of the memory-diode.

26. The method of claim 25 wherein the step of applying an electrical potential across the selected memory-diode from higher to lower electrical potential in the forward direction of the selected memory-diode is a memory diode-read step.

* * * * *